United States Patent
Hiyoshi et al.

[11] Patent Number: 5,835,985
[45] Date of Patent: *Nov. 10, 1998

[54] REVERSE CONDUCTING GATE-TURNOFF THYRISTOR

[75] Inventors: Michiaki Hiyoshi; Takashi Fujiwara; Hideo Matsuda, all of Yokohama; Satoshi Yanagisawa; Susumu Iesaka, both of Tokyo; Tatuo Harada, Yokohama, all of Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 305,661

[22] Filed: Sep. 14, 1994

[30] Foreign Application Priority Data

Sep. 14, 1993 [JP] Japan ................................. 5-252336
Oct. 14, 1993 [JP] Japan ................................. 5-256732

[51] Int. Cl.⁶ .......................... H01L 29/74; H01L 31/111
[52] U.S. Cl. ................ 257/121; 257/126; 257/128; 257/138; 257/146; 257/154
[58] Field of Search ........................... 257/121, 126, 257/128, 138, 146, 147, 153, 154

[56] References Cited

U.S. PATENT DOCUMENTS 4,791,470  12/1988  Shinohe et al. ......................... 357/38
4,857,983  8/1989  Baliga et al. ............................ 357/38
5,047,824  9/1991  Tokunoh et al. ........................ 357/39

FOREIGN PATENT DOCUMENTS 2-20070      1/1980   Japan .
63-202968    8/1988   Japan .
63-311764   12/1988   Japan .
1-253274    10/1989   Japan .
2-240965     9/1990   Japan .

OTHER PUBLICATIONS

IEEE Transactions on Industry Applications, vol. 26, No. 5, pp. 835–838, Sept./Oct. 1990, Osamu Hashimoto, et al., "2.5–KV 2000–A Monolithic Reverse Conducting Gate Turn–Off Thyristor".

Patent Abstracts of Japan, vol. 11, No. 77, Mar. 7, 1987, JP-A-61232671, Oct. 16, 1986.

Patent Abstracts of Japan, vol. 12, No. 447, Nov. 24, 1988, JP-A-63174369, Jul. 18, 1988.

Primary Examiner—Ngân V. Ngô
Attorney, Agent, or Firm—Oblon, Spivak, McClelland, Maier & Neustadt, P.C.

[57] ABSTRACT

A reverse conducting gate-turnoff thyristor includes a switching device section, a diode section, and an isolating section located between the switching device section and the diode section. The isolating section includes an impurity layer formed by controlling impurity diffusion and having an impurity concentration lower than those of the switching device section and the diode section.

1 Claim, 9 Drawing Sheets

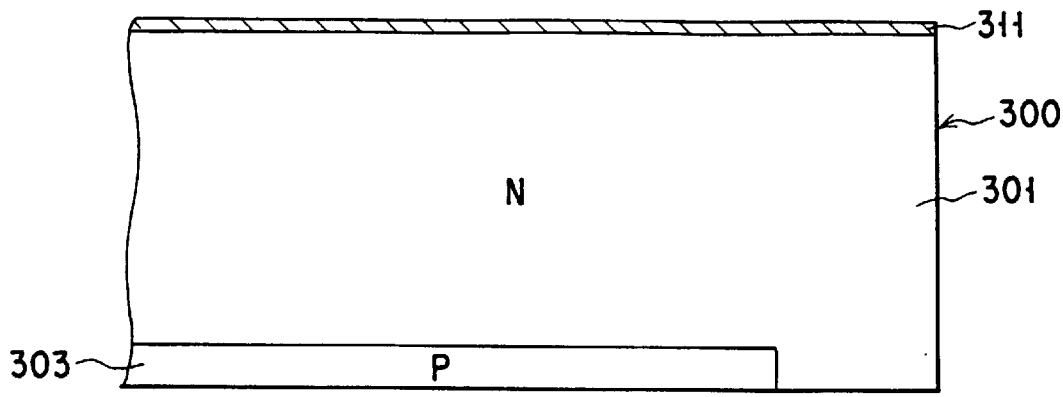
F I G. 7
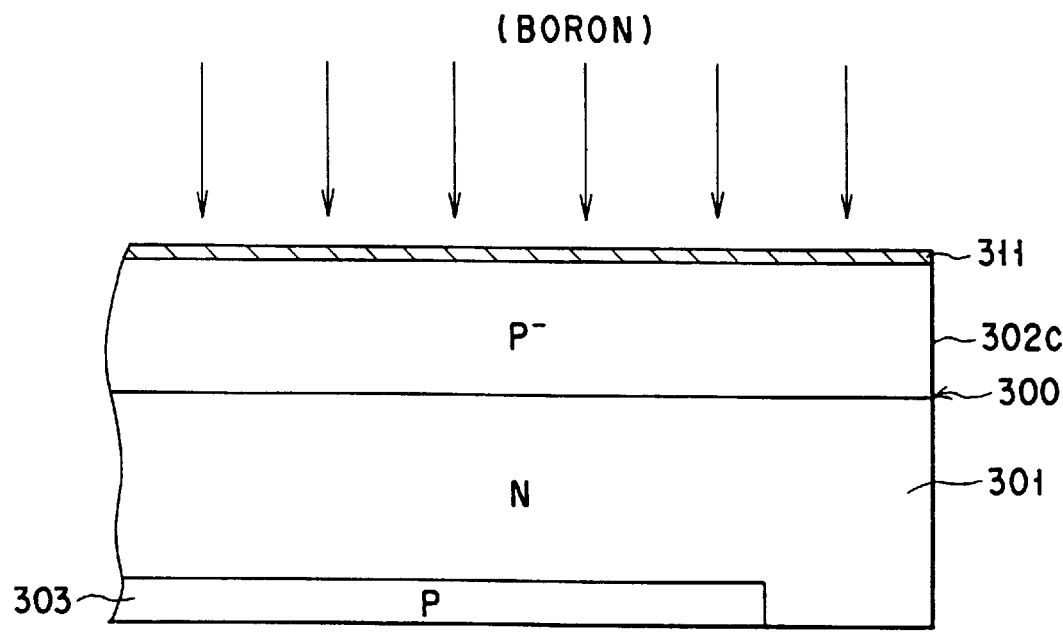
F I G. 8

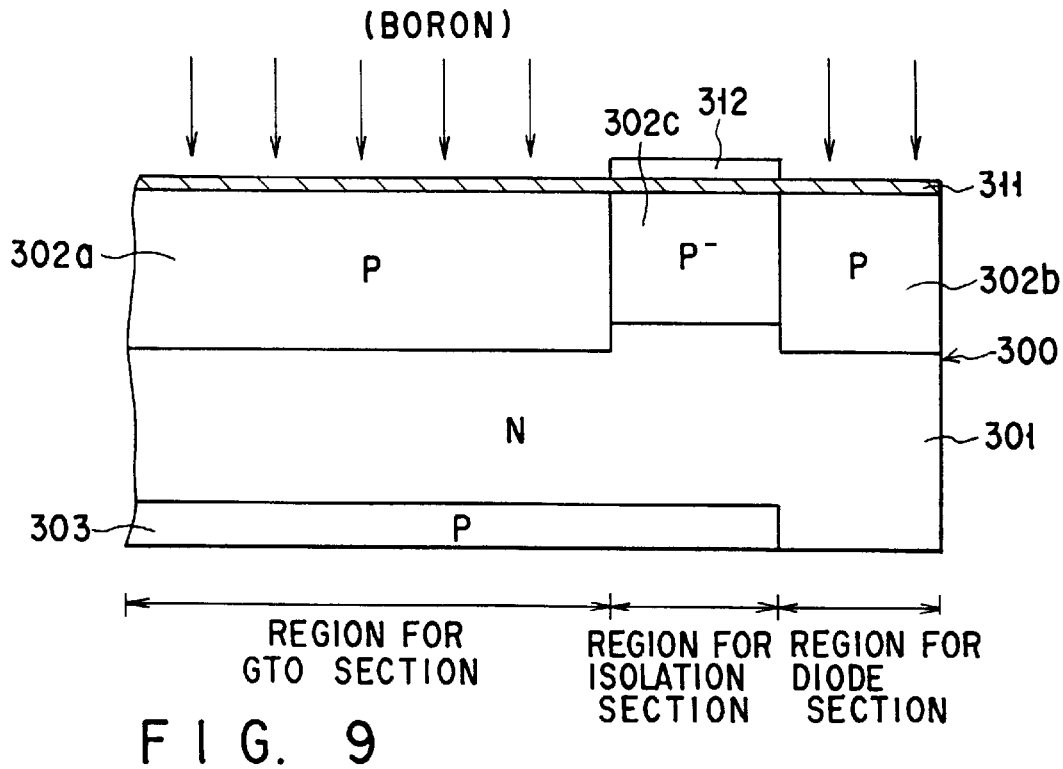
F I G. 9
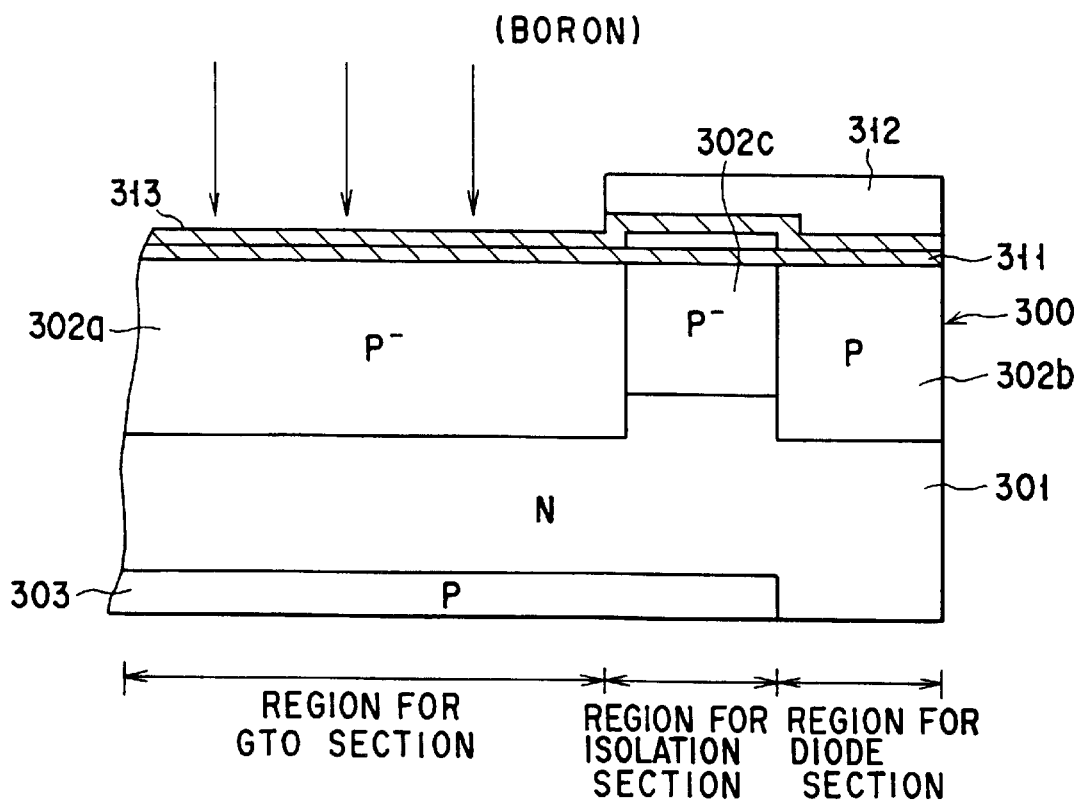
F I G. 10

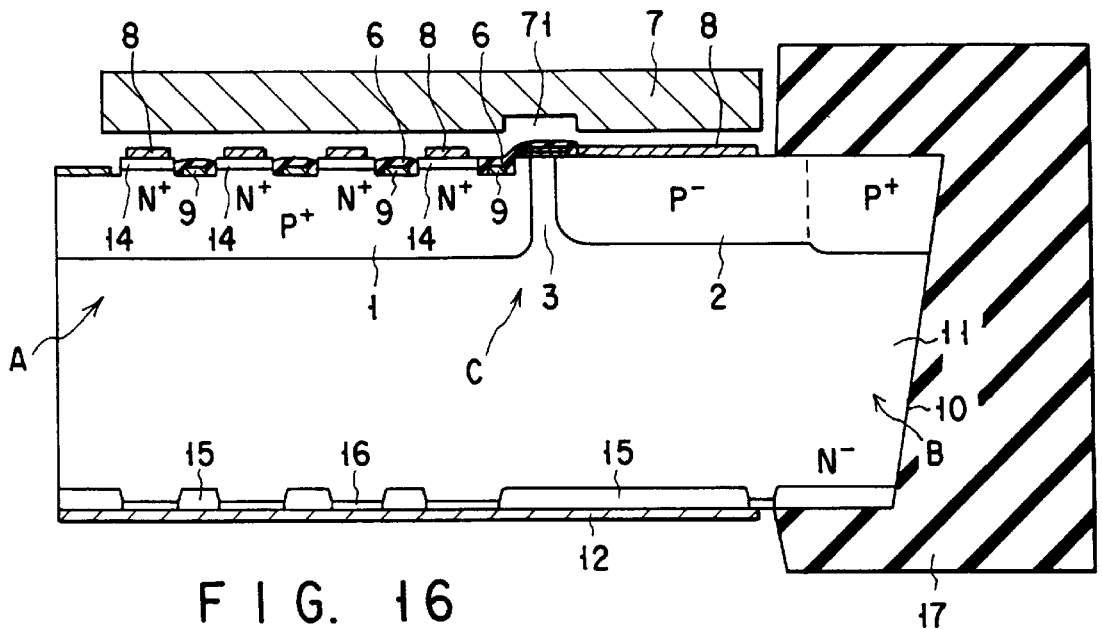
F I G. 16
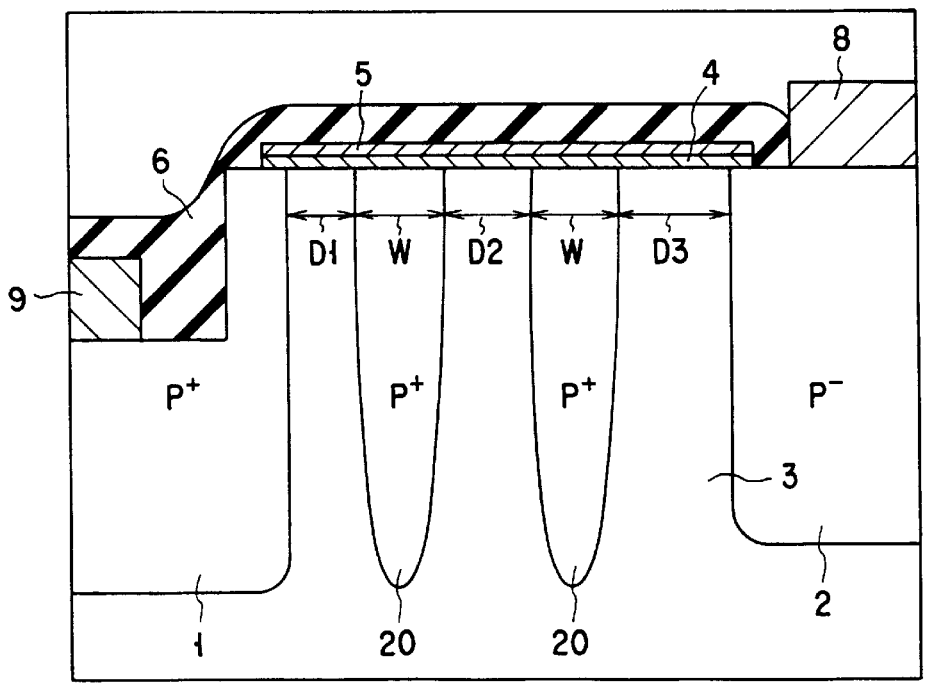
F I G. 17

REVERSE CONDUCTING GATE-TURNOFF THYRISTOR

BACKGROUND OF THE INVENTION

1. Field of the Invention

The present invention relates to a reverse conducting gate-turnoff thyristor, and more particularly to a reverse conducting gate-turnoff thyristor which has an improved structure for isolating a switching device section and a diode section from each other.

2. Description of the Related Art

A reverse conducting switching device, such as a reverse conducting gate-turnoff thyristor is generally comprised of a GTO (Gate-Turnoff) thyristor and a freewheel diode which are formed in a single semiconductor substrate in the form of an integrated circuit. The freewheel diode connected in inverse parallel to the GTO thyristor. A GOT thyristor is a semiconductor device which serves to miniaturize a device, such as an inverter, which incorporates the thyristor. The semiconductor substrate in which a reverse conducting GTO thyristor is formed has a thyristor section and a diode section. The thyristor section in which the GTO thyristor is formed and the diode section in which the freewheel diode is formed are electrically isolated by a resistor.

A conventional reverse conducting GTO thyristor will be described with reference to FIG. 1.

As shown in FIG. 1, an n-type layer 501 consists of an n-type base layer 501a and an n-type impurity layer 501b. A mesa-etched, p-type base layer 502a is provided on the upper surface of the n-type base layer 501a. An n-type emitter layer 504 is provided on the mesa-shaped part of a p-type base layer 502a. A p-type emitter layer 503 is provided on the lower surface of the n-type base layer 501a. The p-type emitter layer 503, the n-type base layer 501a, the p-type base layer 502 and the n-type emitter layer 504 constitute a four-layer pnpn structure which is a GTO (Gate-Turnoff) thyristor section A.

A p-type impurity layer 502b is provided on the upper surface of the n-type impurity layer 501b, forming a two-layer pn structure which is a diode section B.

The GTO section A has an anode electrode 508a provided on the lower surface of the p-type emitter layer 503. The diode section B has a cathode electrode 508b provided on the lower surface of the n-type impurity layer 501b. The anode electrode 508a and the cathode electrode 508b form an integral layer. The GTO section A has a cathode electrode 505 provided on the upper surface of the n-type emitter layer 504, and a gate electrode 506 provided on that part of the p-type base layer 502a which are not mesa-shaped. The diode section B has an anode electrode 507 provided on the upper surface of the p-type impurity layer 502b.

A conventional reverse conducting GTO thyristor is manufactured as follows. First, a p-type impurity such as boron is ion-implanted into a semiconductor substrate and diffused therein, forming a p-type layer 502a on the upper surface of an n-type layer 501. Next, an n-type impurity such as phosphorus is ion-implanted into the upper surface of the p-type layer 502a and diffused therein, thereby forming an n-type layer 504. A BSG (Boron Silicate Glass) film is deposited by CVD method on the lower surface of the n-type layer 501. The boron in the BSG film is thermally diffused into the n-type layer 501 (by means of isolation diffusion), thereby forming a p-type emitter layer 503. The n-type layer 504 and the p-type layer 502a are mesa-etched, forming a GTO section which has the shape shown in FIG. 1.

In order to form an isolation section C between the GTO section A and diode section B of the reverse conducting GTO thyristor described above, a selected portion of the p-type impurity layer 502 is etched to a thickness about half the initial thickness of the layer 502. The section C, i.e., the thin portion of the layer 502, serves as an isolation resistor 509.

To turn off the reverse conducting GTO thyristor shown in FIG. 1, a reverse voltage is applied between the gate electrode 506 and cathode electrode 505 of the GTO section A. At this time, the cathode electrode 505 of the GTO section A and the anode electrode 507 of the diode section B are electrically connected and, hence, set at the same potential. The potential of the anode electrode 507 of the diode section B is higher than that of the gate electrode 506 of the GTO section A. A current therefor flows from the anode electrode 507 through the isolation resistor 506 to the gate electrode 506 of the GTO section A. When a voltage is applied on the GTO section A in the forward direction immediately after a forward current has been made to flow in the diode section B, the carriers (i.e., holes) flown into the n-type impurity layer 501b of the diode section B diffuse into the n-type base layer 501a of the GTO section A. Consequently, the reverse conducting GTO thyristor may be turned on though no gate signal is supplied to it. In other words, there is the possibility of a so-called "erroneous turn-on" of the GTO thyristor may take place. To prevent an erroneous turn-on, it is required that the isolation resistor 509 of the isolation section C have as high a resistance as possible.

In order to increase the resistance of the isolation resistor 509, it is necessary to etch a selected portion of the p-type impurity layer 502 as much as possible. Here arises a problem. The thinner the isolation section C, the more greatly an electric field will be concentrated. Inevitably, the isolation section c will have but a low insulation withstand voltage. It would be extremely difficult provide the isolation section C with a sufficient resistance and a sufficient withstand voltage.

The selected portion of the p-type impurity layer 502 can hardly be etched to a desired depth. To put it another way, it is difficult to etch impurity layers to the same depth, and the isolation resistors formed by etching these impurity layers will have different resistances.

FIG. 2 is a plan view showing a half of the conventional anode-short-circuiting, reverse conducting GTO thyristor. FIG. 3 is a sectional view taken along line III—III in FIG. 2. As seen from FIG. 3, this GTO thyristor comprises a semiconductor substrate 10, a thyristor section A located in the center portion of the substrate 10 and a diode section B provided in the edge portion of the substrate 10. An N⁻ base region 31 is provided in the semiconductor substrate 10. A P⁺ base region 32 and an N⁺ base region 33 are provided on the upper surface and lower surface of the N⁻ base region 31, respectively. A plurality of P⁺ emitter regions 34 are provided in that portion of the N⁺ base region 33 which is one part of the thyristor section A. A plurality of N⁺ regions 35 are provided in the upper surface of the P⁺ base region 32.

The P⁺ base region 32 is about 80 μm thick, the N⁻ base region 31 is about 650 μm thick, and the N⁺ base region 33 is about 20 μm thick. The P⁺ base region 32 has an annular trench 36 in its upper surface. The trench 36 has a depth of about 50 μm; it has has been formed by etching a selected surface portion of the P⁺ base region 32. Those portions of the P⁺ base region 32 and that portion of the N⁻ base region 31, which are located below the annular trench 36, constitute an isolation section C. That portion of the P⁺ base region 32 which is located below the trench 36 is a P base region 321 which has a low impurity concentration (about $10 \times 10^{15}$ cm$^{-3}$) and which functions as an isolation resistor region $R_{GK}$. The trench 36 surrounds the thyristor section A, isolating the section A from the diode section B. Cathode electrodes 38, which are layers of metal such as aluminum, are mounted on the N$^+$ emitter regions 35 and on the P$^-$ base region 32 of the diode section B. These electrodes 38 constitute a cathode unit K. Gate electrodes 39 are provided on the P$^+$ base region 32 and constitute a gate unit G. The gate electrodes 39 are covered with an insulating film 40, whereby the cathode electrodes 38 are insulated from the gate electrodes 39. An anode electrode 41, which is a layer of metal such as aluminum, is provided on the N$^+$ base region 33 and the P$^+$ emitter regions 34. The anode electrode 41 is connected to an anode lead AD. The anode electrode 41 connects the N$^+$ base region 33 to the P$^+$ emitter regions 34, forming a short circuit. The N$^+$ base region 33, the P$^+$ emitter regions 34 and the anode electrode 41 constitute a short emitter structure, which enhances the turnoff ability of the conventional reverse conducting GTO thyristor.

FIG. 4 is an equivalent circuit diagram of the reverse conducting GTO thyristor shown in FIGS. 2 and 3. As shown in FIG. 4, the GTO thyristor comprises a GTO thyristor 42 and a freewheel diode 43 which correspond to the thyristor section A and the diode section B, respectively. The GTO thyristor 42 comprises the P$^+$ emitter regions 34, the P base region 31, the P$^+$ base region 32, and the N$^+$ emitter regions 35. The freewheel diode 43 comprises the P$^+$ base region 32, the P base region 31, and the N$^+$ base region 33. The diode 43 is inversely connected in parallel to the GTO thyristor 42. The isolation resistor region $R_{GK}$ (or the P base region 321), which is one part of the isolation section C, is connected between the gate and cathode of the GTO thyristor 42.

The PN junction formed by each N$^+$ emitter region 35 and the P$^+$ base region 32 must be reversely biased in order to control the injection of electrons from the N$^+$ emitter region 35 into the P$^+$ base region 32 at the time of turning off the GTO thyristor. To this end, a reverse bias is applied on each cathode electrodes 38 and the gate electrodes 39 when the GTO thyristor is to be turned off. At this time, an ineffective current flows through the isolation resistor region $R_{GK}$, and the load on a gate drive circuit (not shown) increases. To reduce this load, it is desirable that the isolation resistor region $R_{GK}$ have as high a resistance as possible. In this conventional GTO thyristor, the isolation resistor region $R_{GK}$ has a resistance of about 70 to 100 Ω.

A reverse conducting switching device, such as a reverse conducting GTO thyristor, is used, inversely connected in parallel to a freewheel diode. During the off-period of the switch, a negative bias of 2 to 18V needs to be continuously applied between the gate and cathode of the GTO thyristor. As mentioned above, the P base region and the P anode region are electrically connected. Hence, when a reverse bias is applied between the gate and cathode of the GTO thyristor, a reverse current flows through the isolation resistor region provided between the gate and the cathode. Therefore, the gate drive circuit must have a larger power-supply capacitance than in the case no diode is connected to the GTO thyristor, and the power loss is inevitably as much greater.

The isolation resistor region of the conventional reverse conducting GTO thyristor has a resistance of about 70 to 100Ω. The resistance varies greatly, depending on the depth of the trench formed by mesa-etching and on the method of diffusing the impurity to from the P base region. Moreover, the temperature-dependency of this resistance is prominent; the resistance is low at low temperatures. Consequently, it is difficult to control the resistance of the isolation register region during the manufacture of the reverse conducting GTO thyristor. It is also difficult to design a circuit for driving the gate of the reverse conducting GTO thyristor.

SUMMARY OF THE INVENTION

In view of the foregoing, it is an object of the present invention to provide a reverse conducting GTO thyristor in which an isolation region provided between a switching device section and a diode section has no trench formed by mesa-etching, has a lower impurity concentration than those of the switching device section and the diode section, due to impurity-diffusion control has an optimal relationship between resistance and withstand voltage, and which is hardly turned on erroneously.

It is another object of the present invention to provide a reverse conducting GTO thyristor in which a base region is provided between a switching device section and a diode section, completely isolating the switching device section and the diode section from each other.

According to the invention, there is provided a reverse conducting GTO thyristor which comprises:

a semiconductor layer of a first conductivity type;

a first impurity layer of a second conductivity type, provided on a part of a lower surface of the semiconductor layer;

a second impurity layer of the second conductivity type provided on an upper surface of the semiconductor layer, opposing the first impurity layer and constituting a part of a switching device section;

a third impurity layer of the second conductivity type, provided on the upper surface of the semiconductor layer spaced apart from the second impurity layer and constituting a part of a diode section;

at least one fourth impurity layer of the first conductivity type provided on the upper surface of the second impurity layer;

a fifth impurity layer of the second conductivity type provided on the upper surface of the semiconductor layer and on an isolation section located between the second impurity layer and the third impurity layer and having an impurity concentration lower than those of the second and third impurity layers;

anode electrodes provided on a lower surface of the semiconductor substrate, including a lower surface of the first impurity layer;

at least one gate electrode provided on that part of the upper surface of the second impurity layer which is other than the fourth impurity layer;

a cathode electrode provided on an upper surface of the one fourth impurity layer; and an anode electrode of a diode section, provided on an upper surface of the third impurity layer.

According to the invention, there is provided another reverse conducting GTO thyristor which comprises:

a semiconductor layer of a first conductivity type;

a first impurity layer of a second conductivity type, provided on a part of a lower surface of the semiconductor layer;

a second impurity layer of the second conductivity type provided on an upper surface of the semiconductor layer, opposing the first impurity layer and constituting a part of a switching device section;

a third impurity layer of the second conductivity type, provided on the upper surface of the semiconductor layer spaced apart from the second impurity layer and constituting a part of a diode section;

at least one fourth impurity layer of the first conductivity type provided on the upper surface of the semiconductor layer;

a fifth impurity layer of the second conductivity type contacting the upper surface of the semiconductor layer and on an isolation section between the second impurity layer and the third layer and having a lower surface flush with lower surfaces of the second and third impurity layers and having an impurity concentration lower than those of the second and third impurity layers;

anode electrodes provided on a lower surface of the semiconductor substrate, and on a lower surface of the first impurity layer;

a sixth impurity layer of the first conductivity type provided on an upper surface of the fifth impurity layer;

at least one gate electrode provided on that part of the upper surface of the second impurity layer which is other than the fourth impurity layer;

a cathode electrode provided on an upper surface of the fourth impurity layer; and an anode electrode of a diode section, provided on an upper surface of the third impurity layer.

According to the invention, there is provided still another reverse conducting GTO thyristor which comprises:

a first semiconductor region of a first conductivity type;

a second semiconductor region of a second conductivity type provided in an upper surface region of the first semiconductor region;

a third semiconductor region of the second conductivity type provided in a lower surface region of the first semiconductor region and opposing the second semiconductor region;

a fourth semiconductor region of the second conductivity type provided on an upper surface of the second semiconductor region;

a fifth semiconductor region of the second conductivity type provided in an upper surface region of the first semiconductor region, spaced apart from the second semiconductor region and constituting a part of a diode section;

an isolation region of the first conductivity type provided in an upper surface region of the first semiconductor region and located between the second semiconductor region and the fifth semiconductor region;

a first electrode provided on a lower surface of the first semiconductor region and a lower surface of the third semiconductor region;

a second electrode provided on an upper surface of the fourth semiconductor region and an upper surface of the fifth semiconductor region; and a third electrode provided on an upper surface of the second semiconductor region.

In each reverse conducting GTO thyristor according to the invention, the isolation section has no trench formed by mesa-etching. Rather, it has a lower impurity concentration than those of the switching device section and the diode section, due to impurity-diffusion control. The isolation section has an optimal relationship between resistance and withstand voltage. The resistance of the isolation region is scarcely different from a design value. The reverse conducting GTO thyristor of this invention is, therefore, hardly turned on erroneously.

The reverse conducting GTO thyristor according of this invention has its switching device section and its diode section completely isolated from each other. No leak current therefore flows when the negative bias is applied on the switching device, and the reverse conducting GTO thyristor can be used along with the ordinary GTO thyristor in a gate circuit. Moreover, the reverse conducting GTO thyristor can be easily manufactured since the isolation resistor need not be controlled. It can be manufactured to have desired characteristics since the switching device section and the diode section are formed in separate diffusion regions. In addition, it will have a stable surface potential and a high withstand voltage if a resistor layer is formed in the surface of the semiconductor substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a sectional view, explaining a step of manufacturing the reverse conducting GTO thyristor shown in FIG. 5;

FIG. 8 is a sectional view, explaining the step following the step shown in FIG. 7;

FIG. 9 is a sectional view explaining the step following the step illustrated in FIG. 8;

FIG. 10 is a sectional view, explaining the step following the step shown in FIG. 9;

FIG. 16 is a sectional view illustrating a major part of a reverse conducting GTO thyristor which is a fifth embodiment of the invention;

FIG. 17 is an enlarged sectional view of the isolation section of a reverse conducting GTO thyristor which is a sixth embodiment of this invention;

DETAILED DESCRIPTION OF THE PREFERRED EMBODIMENTS

An embodiment of the present invention will be described.

Figure 5:
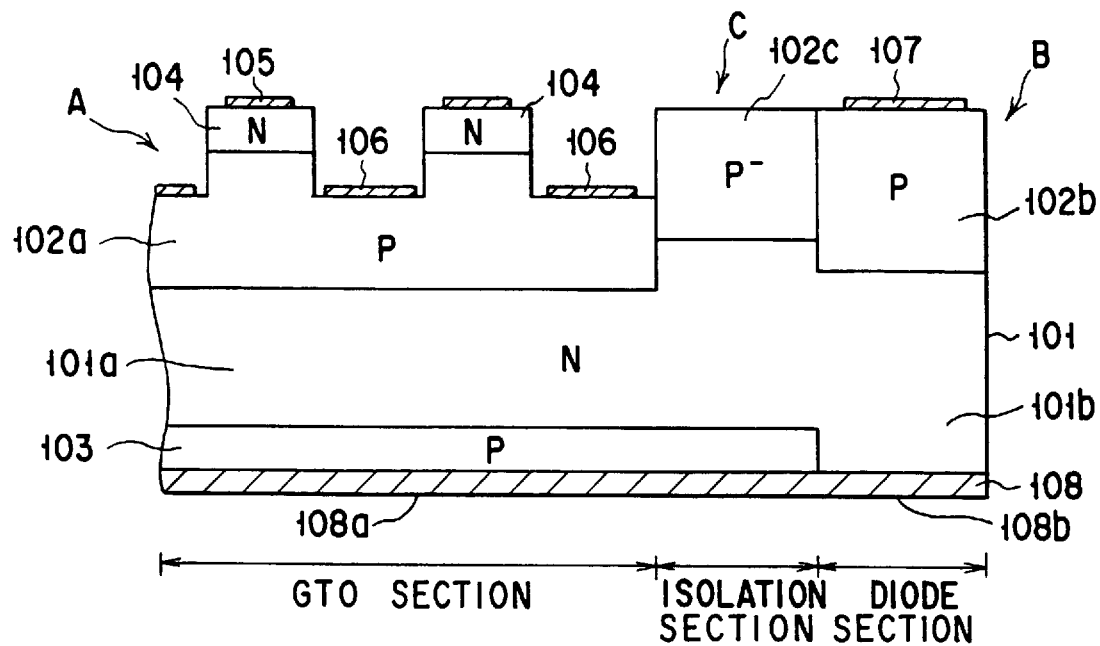
FIG. 5 is a sectional view showing a major part of a reverse conducting GTO thyristor which is a first embodiment of the present invention.

FIG. 5 shows a major part of the first embodiment, i.e., a reverse conducting GTO thyristor. As shown in FIG. 5, the reverse conducting GTO thyristor has an n-type layer 101. The layer 101 consists of an n-type base layer 101a and an n-type impurity layer 101b.

A mesa-etched, p-type base layer 102a is provided on the upper surface of the n-type base layer 101a. An n-type emitter layer 104 is provided on the mesa-shaped part of a p-type base layer 102a. A p-type emitter layer 103 is provided on the lower surface of the n-type base layer 101a. The p-type emitter layer 103, the n-type base layer 101a, the p-type base layer 102 and the n-type emitter layer 104 constitute a four-layer pnpn structure which is a GTO section A.

A p-type impurity layer 102b is provided on the upper surface of the n-type impurity layer 101b. The layers 101b and 102b form a two-layer pn structure which is a diode section B.

The GTO section A has an anode electrode 108a provided on the lower surface of the p-type emitter layer 103. The diode section B has a cathode electrode 108b provided on the lower surface of the n-type impurity layer 101b. The anode electrode 108a and the cathode electrode 108b form an integral layer. The GTO section A has a cathode electrode 105 provided on the upper surface of the n-type emitter layer 104, and a gate electrode 106 provided on that part of the p-type base layer 102a which are not mesa-shaped. The diode section B has an anode electrode 107 provided on the upper surface of the p-type impurity layer 102b.

The reverse conducting GTO thyristor has an isolation section C which isolates the GTO section A and the diode section B. The section C is formed of a p-type impurity layer 102c which has been formed between the p-type base layer 102a and the p-type impurity layer 102b, by means of controlled impurity diffusion.

The p-type base layer 102a, the p-type impurity layer 102b and the p-type impurity layer 102c have different impurity concentrations. That is, the p-type base layer 102a has a higher impurity concentration than the p-type impurity layer 102b, which in turn has a higher impurity concentration than the p-type impurity layer 102c. For example, the layers 102a, 102b, and 102c have an impurity concentration of $1\times10^{18}$ cm$^{-3}$, an impurity concentration of $1\times10^{17}$ cm$^{-3}$, and an impurity concentration of $1\times10^{15}$ to $1\times10^{6}$ cm$^{-3}$, respectively. Having the lowest impurity concentration of the three, the p-type impurity layer 102c performs the function of a resistor. The lower its impurity concentration, the higher resistance the p-type impurity layer 102c has, and the smaller the current which flows from the anode electrode 107 to the gate electrode 106 of the GTO section A when the reverse conducting GTO thyristor is turned off. Hence, there is no possibility that the GTO thyristor is erroneously turned on when no gate signal is supplied to it.

The single p-type emitter layer 103 may be replaced by a plurality of p-type emitter layers which are provided on the upper surface of the anode-side, n-type layer 101a and which extend in radial direction of the emitter layer 103. In this case, the device is an anode-short-circuiting, reverse conducting GTO thyristor.

Figure 6:
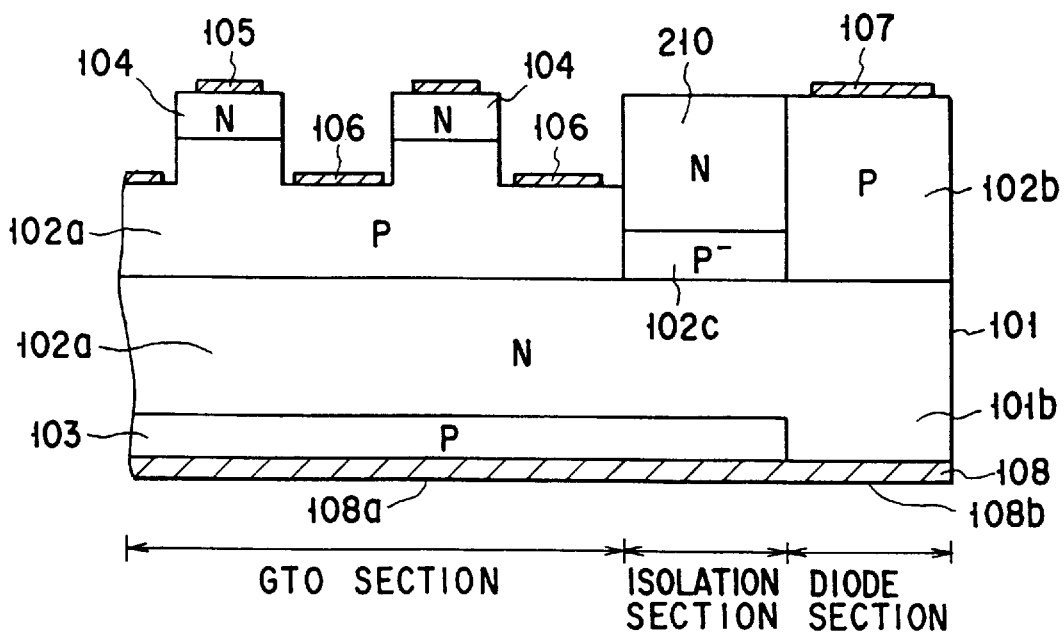
FIG. 6 is a sectional view illustrating a major part of a reverse conducting GTO thyristor which is a second embodiment of the invention.

A reverse conducting GTO thyristor according to a second embodiment of the invention will be described, with reference to FIG. 6. This GTO thyristor differs from the first embodiment (FIG. 5) in two respects. First, in the isolation section C, the lower surface of the p-type impurity layer 102c is flush with the lower surfaces of the p-type base layer 102a and p-type impurity layer 102b. Second, the p-type impurity layer 102c has its upper surface contacting the lower surface of an n-type impurity layer 210 and is thinner than in the first embodiment. The layer 102c therefore prevents an electric field from being concentrated at the end of the p-type base layer 102a or the p-type impurity layer 102b. The reverse conducting GTO thyristor shown in FIG. 6 is identical to the first embodiment in all other respects. Each component identical or similar to its counterpart of the first embodiment is designated at the same reference numeral and will not be described in detail.

In the second embodiment, too, the p-type base layer 102a, the p-type impurity layer 102b and the p-type impurity layer 102c have different impurity concentrations. To be more specific, the p-type base layer 102a has a higher impurity concentration than the p-type impurity layer 102b, which in turn has a higher impurity concentration than the p-type impurity layer 102c. Having the lowest impurity concentration of the three, the p-type impurity layer 102c performs the function of a resistor. The lower its impurity concentration, the higher resistance the p-type impurity layer 102c has. The layer 102c has a resistance much lower than its counterpart of the first embodiment since it is thinner than its counterpart. As a result, the current, which flows from the anode electrode 107 to the gate electrode 106 of the GTO section A when the reverse conducting GTO thyristor is turned off, is extremely small. There is no possibility that the GTO thyristor is erroneously turned on when no gate signal is supplied to it.

In the second embodiment, as well, the single p-type emitter layer 103 may be replaced by a plurality of p-type emitter layers which are provided on the upper surface of the anode-side, n-type layer 101a and which extend in radial direction of the emitter layer 103. If this is the case, the device is an anode-short-circuiting, reverse conducting GTO thyristor.

It will now be explained how the reverse conducting GTO thyristor according to the first embodiment is manufactured, with reference to FIGS. 7 to 10.

First, as shown in FIG. 7, a silicon oxide film 311 is formed on the upper surface of a semiconductor substrate 300, thereby protecting the surface against ion implantation. The process of forming the film 311 is generally known as "buffer oxidation."

Then, as shown in FIG. 8, a p-type impurity such as boron is ion-implanted into the surface of the semiconductor substrate 300 in a dose of, for example, about $10^{12}$ to $10^{13}$ cm$^{-3}$. The impurity is diffused for 110 hours in an atmosphere of about 1250° C., thereby forming a p-type impurity layer 302c in the surface region of the semiconductor substrate 300.

Next, as shown in FIG. 9, an ion implantation mask 312 is formed by lithography on that portion of the substrate 300 in which an isolation section will be formed. A p-type impurity such as boron is ion-implanted in a dose of, for example, $3 \times 10^{14}$ cm$^{-3}$ into all surface of the substrate 300, except the surface portion to be subjected to buffer oxidation. Thereafter, the structure is left to stand for 30 hours in an atmosphere of about 1250° C., whereby the impurity is diffused, forming a p-type impurity layer 302b.

Furthermore, as shown in FIG. 10, an ion implantation mask 312 is formed by lithography on those regions of the substrate 300 in which the isolation section and the diode section will be formed. The resultant structure is subjected to buffer oxidation. A p-type impurity such as boron is ion-implanted in a dose of, for example, $2.2 \times 10^{15}$ cm$^{-3}$ into the surface of that portion of the substrate 300 in which the GTO section will be formed. The structure is then left to stand for 110 hours in an atmosphere of about 1250° C., thereby forming a p-type base layer 302a.

Thereafter, the silicon oxide film 311 and the ion implantation mask 312 are removed by means of ashing or the like. A p-type emitter layer 303 is formed in the lower surface of an n-type layer 101 by means of isolation diffusion. The GTO section is formed by forming an n-type layer 313 by CVD method on the p-type base layer 302a, then by mesa-etching the p-type base layer 302a and the n-type layer 313, thus shaping them into the p-type base layer 102a and the n-type emitter layer 104, both shown in FIG. 5. Finally, a cathode electrode 105 and gate electrode 106 of the GTO section and an anode electrode 107 and cathode electrode 108 of the diode section are formed in the positions shown in FIG. 5. Thus is manufactured a reverse conducting GTO thyristor according to the first embodiment of the present invention.

By the method of manufacturing the first embodiment of the invention, the p-type base layer 102a can have an impurity concentration of $1 \times 10^{18}$ cm$^{-3}$, the p-type impurity layer 102b an impurity concentration of $1 \times 10^{17}$ cm$^{-3}$, and the p-type impurity layer 102c an impurity concentration of $1 \times 10^{15}$ to $1 \times 10^{16}$ cm$^{-3}$.

A method of manufacturing the reverse conducting GTO thyristor according to the second embodiment of the invention will now be described, with reference to FIG. 7 to 11.

Figure 11:
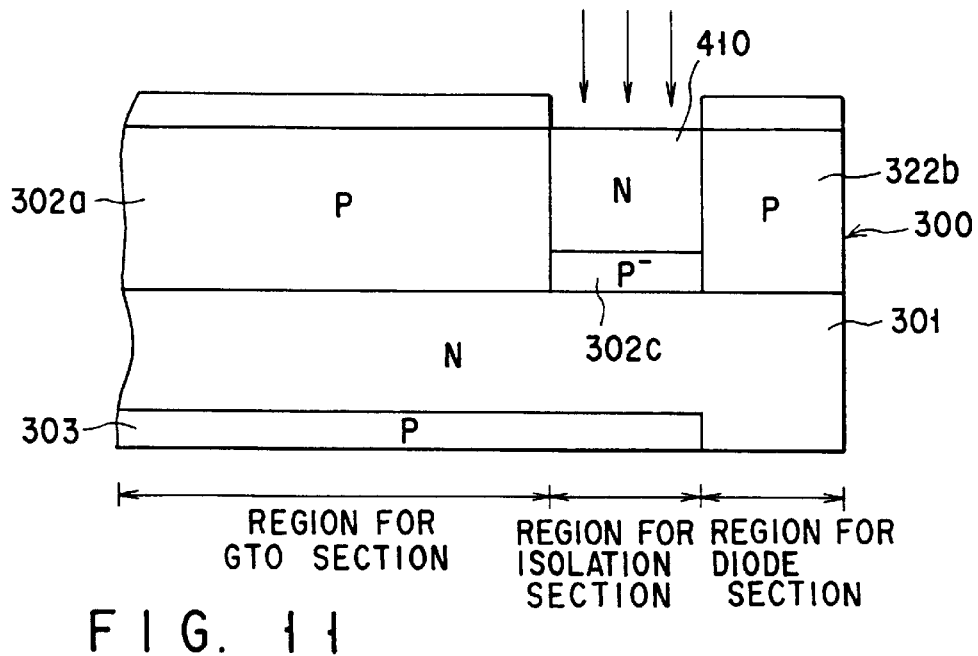
FIGS. 11 is a sectional view, explaining one of the steps of manufacturing the reverse conducting GTO thyristor shown in FIG. 6.

In this method, a p-type base layer 302a, a p-type impurity layer 302b and a p-type impurity layer 302c are formed in the same way as in the method of manufacturing the first embodiment —as illustrated in FIG. 7 to 10. After these three impurity layers have been formed, the silicon oxide film 313 formed by buffer oxidation and the mask used during the ion implantation are removed as illustrated in FIG. 11. Then, a mask is formed by lithography on the GTO section and diode section of the semiconductor substrate 300. An n-type impurity such as phosphorus is ion-implanted into the surface of the isolation section of the substrate 300 and subsequently diffused, forming an n-type impurity layer 410, as shown in FIG. 11. The n-type impurity can be applied in any dose so far as the region for the layer 410 acquires n-type conductivity. Thereafter, the structure is processed in the same manner as in the manufacture of the first embodiment. The components identical to those of the first embodiment are designated at the same numerals in FIG. 11 and will not described in detail.

By the method explained with reference to FIGS. 7 to 11, there can be manufactured the reverse conducting GTO thyristor shown in FIG. 6, which is the second embodiment of the present invention.

A reverse conducting GTO thyristor, which is a third embodiment of the invention and characterized in that the switching device section and the diode section are completely separated from each other, will now be described with reference to FIGS. 12 to 14.

This reverse conducting GTO thyristor is one for use a reverse conducting switching device. FIG. 12 show a half of a disc-shaped semiconductor substrate which has a diameter of about 91 mm. FIG. 13 is an enlarged view of the part R (FIG. 12) of the GTO thyristor, and FIG. 14 is an equivalent circuit diagram of the GTO thyristor.

Figure 12:
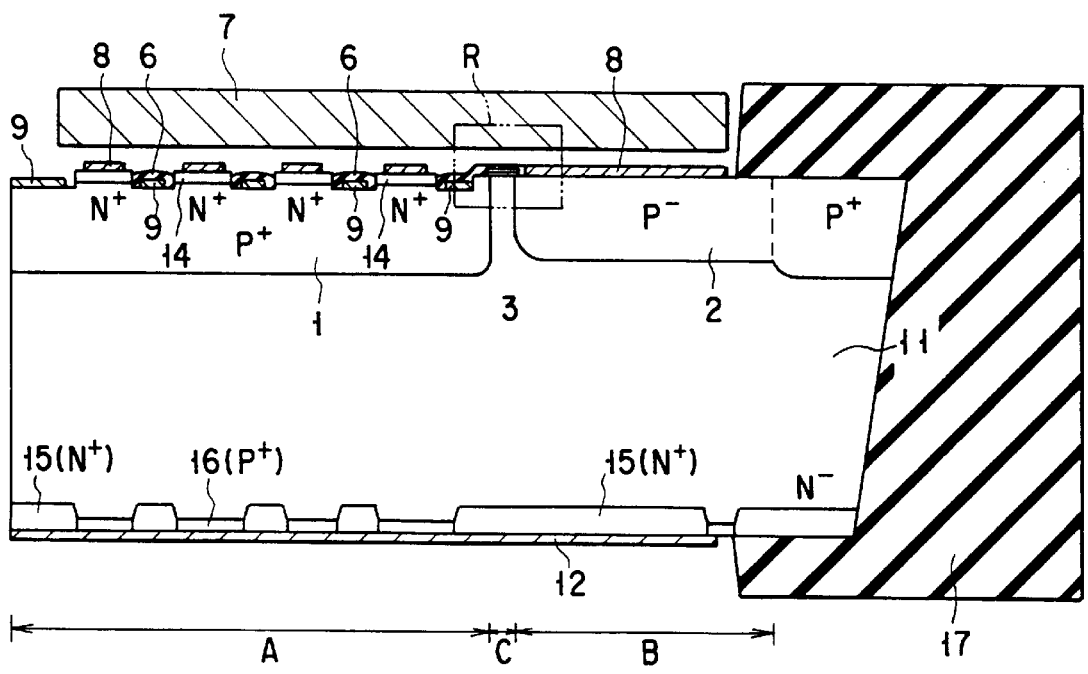
FIG. 12 is a sectional view showing a major part of a reverse conducting GTO thyristor which is a third embodiment of this invention.

As shown in FIG. 12, a thyristor section A is provided in the central part of a bevel-structured semiconductor substrate 10. Also in the substrate 10, a diode section B is provided, surrounding the thyristor section A. An isolation section C is located between the thyristor section A and the diode section B, isolating the sections A and B from each other. An N$^-$ base region 11, i.e., a first semiconductor region, is provided in the silicon semiconductor substrate 10. A P$^+$ base region 1, i.e., a second semiconductor region, is provided in the upper surface of the N$^-$ base region 11. N$^-$ base regions 15 are provided in the lower surfaces of the sections A and B. P$^+$ base emitter regions 16, constituting a third semiconductor region, are provided in selected portions of the base region in the lower surface of the thyristor section A. Mesa-shaped N$^+$ emitter regions 14, constituting a fourth semiconductor region, are provided in selected surface portions of the P$^+$ base region 1 belonging to the thyristor section A.

A P$^-$ anode region 2, i.e., a fifth semiconductor region, about 80 μm thick, is provided in the upper surface of the N$^-$ base region 11 belonging to the diode region B. The P$^+$ base region 1 is about 80 μm thick, measured from the surface of the substrate 10. The N$^-$ base region 11 has a thickness of about 560 μm, and the N$^+$ base regions 15 has a thickness of about 20 μm.

The isolation section C will be described, with reference to the enlarged view of FIG. 13 which shows the region R (FIG. 12) consisting of a part of the section C and the adjacent portions of the sections A and B. As clear from FIG. 13, the isolation section C isolates the thyristor section A and the diode section B, not that the P$^+$ base region 1 of the thyristor section A and the P$^-$ anode region 2 of the diode section B are integral as in the conventional reverse conducting GTO thyristor.

Figure 13:
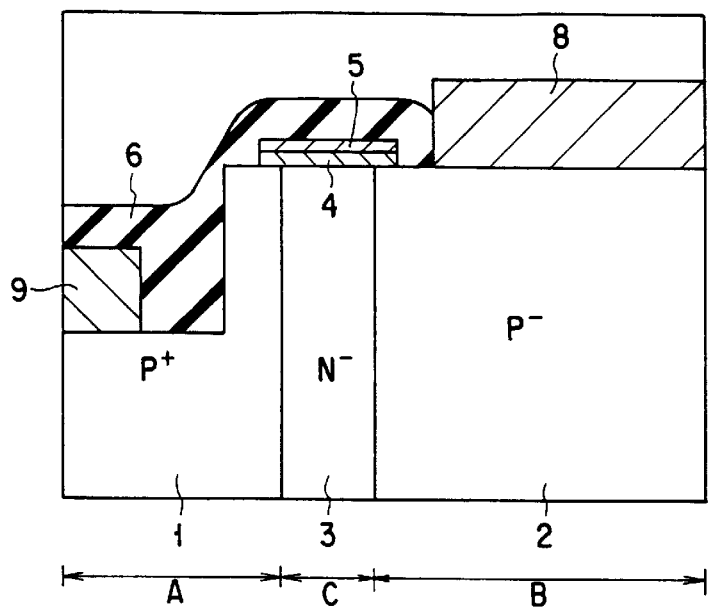
FIG. 13 is an enlarged view of the part R of the GTO thyristor shown in FIG. 12.

As shown in FIG. 13, the isolation section C comprises an isolation region 3 which is a part of the N$^-$ base region 11. The region 3 has an impurity concentration of about $2.1 \times 10^{13}$ cm$^{-3}$. The P$^+$ base region 1 of the thyristor section A has a high impurity concentration; its surface region has an impurity concentration of about $1 \times 10^{17}$ to $1 \times 10^{18}$ cm$^{-3}$. In contrast, the P$^-$ anode region 2 of the diode section B has a low impurity concentration; its surface region has an impurity concentration of about $1 \times 10^{17}$ cm$^{-3}$. The base region 1 and the anode region 2 are spaced apart by 20 to 500 μm by the isolation region 3.

A first insulating film 4 made of $SiO_2$ is provided on a selected portion of the major surface of the substrate 10, covering the pnp junction defined by the regions 1, 2 and 3. A second insulating film 5 made of BPSG (Boron-doped Phospho-Silicate Glass) is provided on the first insulating film 4. A third insulating film 6 made of polyimide is provided on the major surface of the substrate 10, covering the first and second insulating films 4 and 5. Since the pnp junction is protected by the films 4, 5 and 6, each having high resistance, the base region 1 and the anode region 2 are isolated by the region 3 readily. The materials of the insulating films 4, 5 and 6 are not limited to those mentioned above. Any high-resistance materials available can be used.

Cathode electrodes 8 made of metal such as aluminum are provided on the $N^+$ emitter regions 14 and the anode region 2 of the diode section B. Each cathode electrode 8 should have a thickness, e.g., about 14 $\mu$m, larger than the total thickness of the insulating films 4, 5 and 6. Otherwise, the uppermost insulating film 6 would contact the electrode board 7 when an external electrode (not shown) is pressed onto the electrode board 7, pushing the electrode board 7 on the cathode electrodes 8.

As shown in FIG. 12, an anode electrode 12, i.e., a first electrode, made of metal such as aluminum and having a thickness of about 14 $\mu$m, is provided on the $N^+$ base regions 15 and the $P^+$ base emitter regions 16. As shown in FIG. 14, the anode electrode 12 is connected to an anode lead A. The anode electrode 12 provides a short circuit between the $N^+$ base regions 15 and the $P^+$ emitter regions 16, constituting a short emitter structure. This structure improves the turnoff efficiency of the GTO thyristor.

The electrode board 7, which collects electrons, is made of, for example, molybdenum. The electrode board 7 is pressed onto the cathode electrodes 8. Gate electrodes 9, collectively regarded as a third electrode, are provided on the $P^+$ base region 1 of the thyristor section A. As can be understood from FIG. 14, a gate lead G is electrically connected to the gate electrodes 9. The gate electrodes 9 are covered with the insulating film 6, whereby the cathode electrodes 8 are insulated from the gate electrodes 9.

Figure 14:
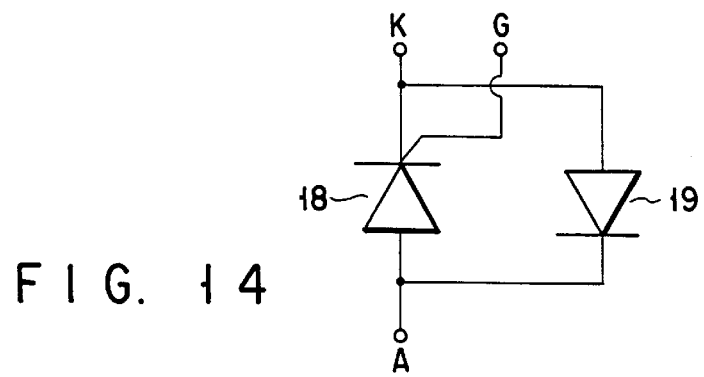
FIG. 14 is an equivalent circuit diagram of the GTO thyristor illustrated in FIG. 12.

As shown in the equivalent circuit diagram of FIG. 14, the thyristor section A and the diode section B function as a GTO thyristor 18 and a freewheel diode 19. The GTO thyristor 18 comprises the $P^+$ emitter regions 16, the $N^-$ base region 11, the $P^+$ base region 1 and the $N^+$ emitter regions 14. The freewheel diode 19 comprises the $P^-$ anode region 2, the $N^-$ base region 11 and the $N^+$ base regions 15, and is connected in inverse parallel to the GTO thyristor 18. No isolation resistor $R_{GK}$ exists in the isolation section C. A protective member 17 made of high-resistance material such as silicone resin covers the sides of the semiconductor substrate 10, electrically insulating the reverse conducting GTO thyristor.

Figure 15:
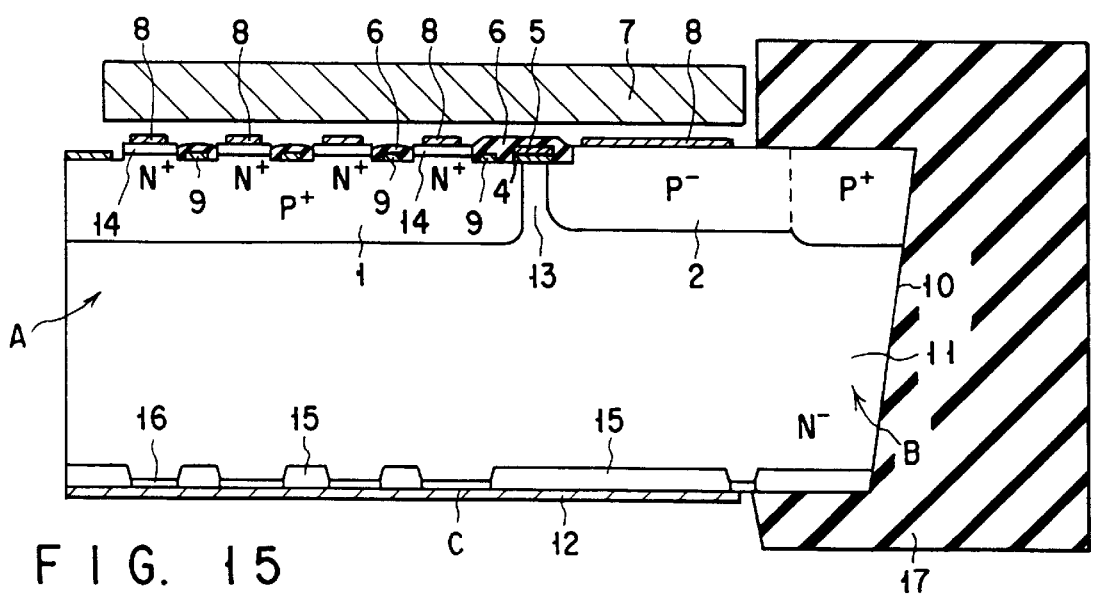
FIG. 15 is a sectional view showing a major part of a reverse conducting GTO thyristor which is a fourth embodiment of the present invention.

A reverse conducting GTO thyristor, which is a fourth embodiment of the present invention, will now be described with reference to FIG. 15. FIG. 15 is a sectional view of the right half of the disc-shaped semiconductor substrate of this embodiment.

As seen from FIG. 15, the fourth embodiment comprises a thyristor section A, a diode section B and an isolation section C. The isolation section C isolates the thyristor section A and the diode section B from each other. The thyristor section A functions as a GTO thyristor, and the diode section B as a freewheel diode. The GTO thyristor comprises $P^+$ emitter regions 16, an N base region 11, a $P^+$ base region 1 and mesa-shaped $N^+$ emitter regions 14. The freewheel diode comprises a $P^-$ anode region 2, the $N^-$ base region 11 and $N^+$ base regions 15 and is connected in inverse parallel to the GTO thyristor. The isolation section C, which isolates the sections A and B from each other, is an isolation region 3 which is a part of the $N^-$ base region 11. An anode electrode 12, i.e., a first electrode, made of metal such as aluminum, is provided on the $N^+$ base regions 15 and the $P^+$ emitter regions 16.

Cathode electrodes 8, collectively regarded as a second electrode and made of metal such as aluminum, are provided on the $N^+$ emitter regions 14 and the anode region 2. An electrode board 7, which is made of, for example, molybdenum and collects electrons, is pressed onto the cathode electrodes 8. Gate electrodes 9, collectively regarded as a third electrode, are provided on the $P^+$ base region 1 of the thyristor section A.

The gate electrodes 9 are covered with the insulating film 6, whereby the cathode electrodes 8 are insulated from the gate electrodes 9. A protective member 17 made of high-resistance material such as silicone resin covers the sides of the semiconductor substrate 10, electrically insulating the reverse conducting GTO thyristor. As in the third embodiment, a first insulating film 4 made of $SiO_2$ is provided on a selected portion of the major surface of the substrate 10, covering the pnp junction defined by the regions the $P^+$ base region 1 of the thyristor section A, the anode region 2 of the diode section B, and the isolation region 3. A second insulating film 5 made of BPSG (Boron-doped Phospho-Silicate Glass) is provided on the first insulating film 4.

In the third embodiment, each cathode electrode 8 should have a thickness larger than the total thickness of the insulating films 4, 5 and 6. This is because the uppermost insulating film 6 would otherwise contact the electrode board 7 when an external electrode (not shown) is pressed onto the electrode board 7, pushing the cathode electrode 8. In the fourth embodiment, too, the insulating film 6 must be kept out of contact with the electrode board 7. To this end, the isolation section C and the adjacent portions of the sections A and B are made thinner than the other portions of the sections A and B. As a result of this, the surface of the uppermost insulating film 6 is located below the surfaces of the cathode electrodes 8, whereby the film 6 is kept out of contact with the electrode board 7. In the fourth embodiment, the $N^+$ emitter regions 14 are shaped like a mesa.

In manufacturing the reverse conducting GTO thyristor according to the fourth embodiment, the surface of the substrate 10 is mesa-etched to form mesa-shaped regions. The surfaces of the isolation section C and the adjacent portions of the sections A and B are mesa-etched as well at the same time. They are thereby lowered, without increasing the number of steps of manufacturing the reverse conducting GTO thyristor. As a result, the insulating film 4, on which the insulating film 5 is provided, is formed on that surface of the substrate 10 which is located as low as those surfaces of the substrate 10 on which the gate electrodes 9 are formed. The gate electrodes 9 are covered and protected by the uppermost insulating film 6.

A reverse conducting GTO thyristor, which is a fifth embodiment of this invention, will now be described with reference to FIG. 16. FIG. 16 is a sectional view of the right half of the disc-shaped semiconductor substrate of this embodiment. This reverse conducting GTO thyristor comprises a thyristor section A, a diode section B and an isolation section C.

The thyristor section A functions as a GTO thyristor, and the diode section B as a freewheel diode. The GTO thyristor comprises P+ emitter regions 16, an N base region 11, a P+ base region 1 and mesa-shaped N+ emitter regions 14. The freewheel diode comprises a P− anode region 2, an N− base region 11 and N+ base regions 15 and is connected in inverse parallel to the GTO thyristor. The isolation section C, which isolates the sections A and B from each other, is an isolation region 3 which is a part of the N− base region 11. An anode electrode 12, i.e., a first electrode is provided on the N+ base regions 15 and the P+ emitter regions 16.

Cathode electrodes 8, collectively regarded as a second electrode, are provided on the N+ emitter regions 14 and the anode region 2. An electrode board 7, which is made of, for example, molybdenum is pressed onto the cathode electrodes 8. Gate electrodes 9, collectively regarded as a third electrode, are provided on the P+ base region 1 of the thyristor section A.

The gate electrodes 9 are covered with the insulating film 6, whereby the cathode electrodes 8 are insulated from the gate electrodes 9. A protective member 17 made of high-resistance material such as silicone resin covers the sides of the semiconductor substrate 10, electrically insulating the reverse conducting GTO thyristor. As in the third embodiment, a first insulating film 4 made of $SiO_2$ is provided on a selected portion of the major surface of the substrate 10, covering the pnp junction defined by the regions the P+ base region 1 of the thyristor section A, the anode region 2 of the diode section B, and the isolation region 3. A second insulating film 5 made of BPSG is provided on the first insulating film 4.

In the first embodiment, each cathode electrode 8 should have a thickness larger than the total thickness of the insulating films 4, 5 and 6. This is because the uppermost insulating film 6 would otherwise contact the electrode board 7 when an external electrode (not shown) is pressed onto the electrode board 7, pushing the electrode board 7 onto the cathode electrodes 8. In the fifth embodiment, too, the insulating film 6 must be kept out of contact with the electrode board 7. To this end, the isolation section C and the adjacent portions of the sections A and B are not made thinner than the other portions of the sections A and B. Instead, a recess 71 is made in a part of the electrode board 7 which contact the cathode electrodes 8 of the diode section B. To be more specific, the recess 71 is formed in that portion of the electrode board 7 which faces the isolation section C and the adjacent portions of the sections A and B. As a result of this, the surface of the insulating film 6, which covers the isolation section C does not contact the electrode board 7 at all.

In the fifth embodiment, the thickness of the aluminum layers, which function as the cathode electrodes 8 or the like, need not be taken into consideration in particular. The insulating film 6 can yet be kept out of contact with the electrode board 7. As in the third embodiment, an insulating protective member 17 made of, for example, silicone resin covers the sides of the semiconductor substrate 10.

A reverse conducting GTO thyristor, which is a sixth embodiment of this invention, will now be described with reference to FIG. 17. FIG. 17 is a sectional view of the disc-shaped semiconductor substrate of this embodiment, more precisely the isolation section and the adjacent portions of the thyristor and diode sections. The reverse conducting GTO thyristor comprises a thyristor section, a diode section and an isolation section. The isolation section isolates the thyristor section and the diode section.

In the embodiment described above, the isolation section is an isolation region 3 which is a part of the N− base region 11, and isolates the P+ base region 1 of the thyristor section A from the P− anode region 2 of the diode section B. The sixth embodiment is characterized in that P+ guard ring 20 is provided in the isolation region 3. Except for this point, the sixth embodiment is identical to the first embodiment.

The P+ base region 1 and the P− anode region 2 are about 80 μm thick, measured from the surface of the substrate 10. The guard ring 20 is also about 80μm thick, measured from the surface of the substrate 10. The guard ring 20 is located substantially in the center portion of the isolation region 3. It needs to have a width W of 20μm or more at the near-surface region of the substrate. It is spaced apart from the P+ base region 1 by a distance D1 of about 20 to 500 μm, and from the P− anode region 2 by a distance D1 of about 20 to 500 μm. The P+ base region 1 has a surface impurity concentration of about $10^{18}$ cm$^{-3}$, while the P− anode region 2 has a surface impurity concentration of about $10^{17}$ cm$^{-3}$. The guard ring 30 is used to expand a depletion layer, thereby to increase withstand voltage of the reverse conducting GTO thyristor.

Figure 18:
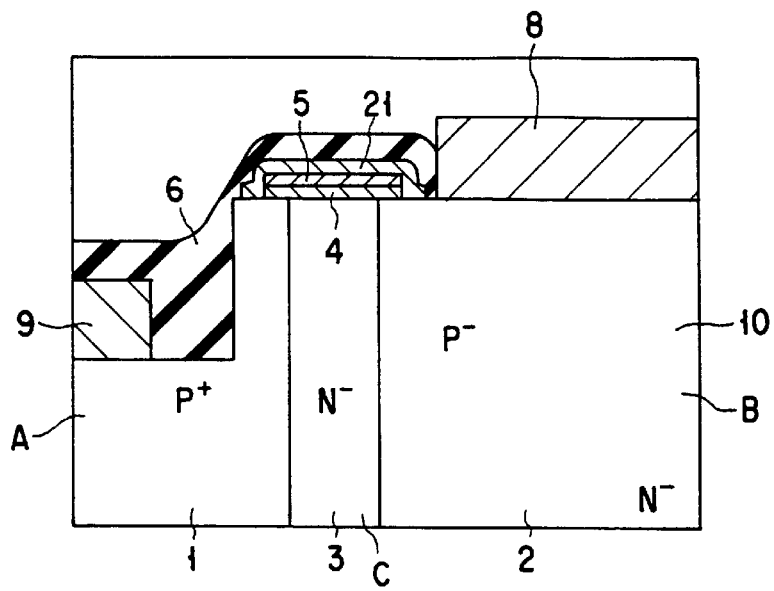
FIG. 18 is a sectional view showing the isolation section and the adjacent portions of the thyristor and diode sections of a reverse conducting GTO thyristor which is a seventh embodiment of the invention.

A reverse conducting GTO thyristor, which is a seventh embodiment of this invention, will now be described with reference to FIG. 18. FIG. 18 is a sectional view of the disc-shaped semiconductor substrate of this embodiment, more precisely the isolation section and the adjacent portions of the thyristor and diode sections. The reverse conducting GTO thyristor comprises a thyristor section, a diode section and an isolation section. The isolation section isolates the thyristor section and the diode section.

In the embodiment described above, the isolation section is an isolation region 3 which is a part of the N− base region 11, and isolates the P+ base region 1 of the thyristor section A from the P− anode region 2 of the diode section B; the first insulating film 4 made of $SiO_2$, the second insulating film 5 made of BPSG and the third insulating film 6 made of polyimide are provided, one on another, in the order mentioned on the isolation section and the adjacent portions of the thyristor and diode sections; and the polyimide film 6 covers and protects the gate electrodes 9. The seventh embodiment is characterized in that a resistive film 21 is provided on the isolation region 3 and the adjacent portions of the sections A and B. Except for this point, the seventh embodiment is identical to the first embodiment.

The resistive film 21 is located between the cathode electrode 8 of the diode section and the gate electrode 9 provided on that portion of the P+ base region 1 which has been etched and hence positioned lower than the other portion. The film 21 contacts the P+ base region 1 of the thyristor section and the P− anode region 2 of the diode section, covering the first insulating film 4 and the second insulating film 5. Both ends of the film 21 contact the semiconductor substrate 10.

The resistive film 21 has been formed by patterning a polycrystalline silicon film deposited by CVD or the like. It is covered and protected by a polyimide film 6. Provided on the substrate 10, the resistive film 21 stabilizes the surface condition of the substrate 10 and, hence, the surface potential thereof. The reverse conducting GTO thyristor according to the seventh embodiment therefore has a high withstand voltage. The seventh embodiment can be represented by the same equivalent circuit diagram as shown in FIG. 14, but its isolation resistor $R_{GK}$ has a resistance much higher than 70Ω.

Figure 19:
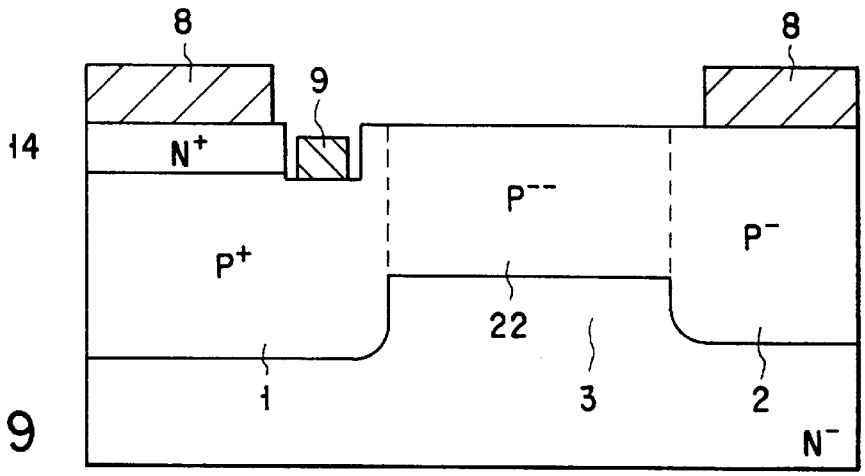
FIG. 19 is a sectional view showing the isolation section and the adjacent portions of the thyristor and diode sections of a reverse conducting GTO thyristor which is an eighth embodiment of the invention.

A reverse conducting GTO thyristor, which is an eighth embodiment of this invention, will now be described with reference to FIG. 19. FIG. 19 is a sectional view of the disc-shaped semiconductor substrate of the eighth embodiment, more precisely the isolation section and the adjacent portions of the thyristor and diode sections. This reverse conducting GTO thyristor comprises a thyristor section, a diode section and an isolation section. The isolation section isolates the thyristor section and the diode section.

Figure 1:
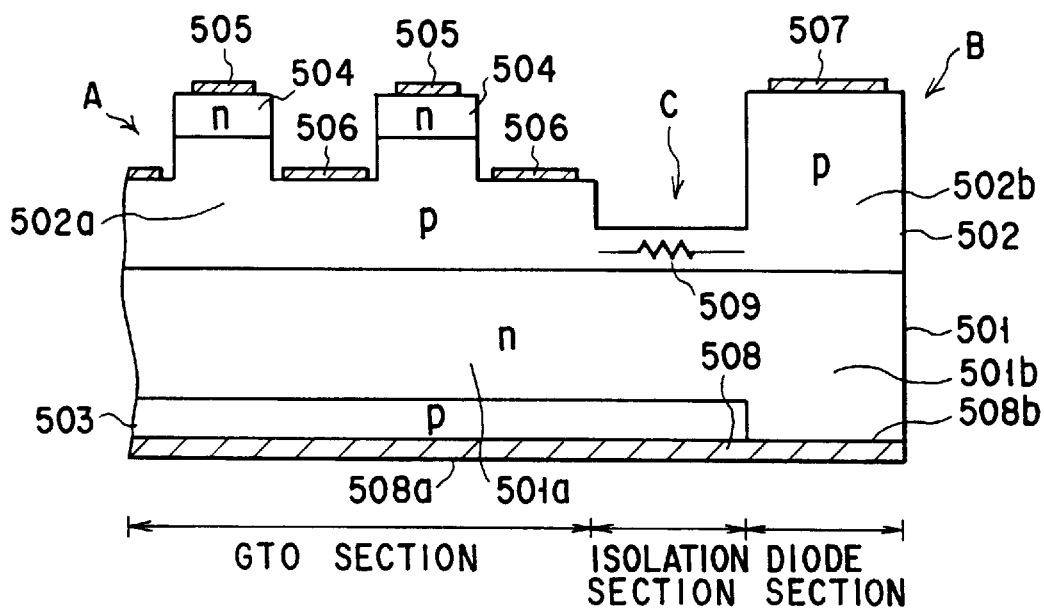
FIG. 1 is a sectional view showing a major part of a conventional reverse conducting GTO thyristor.
Figure 2:
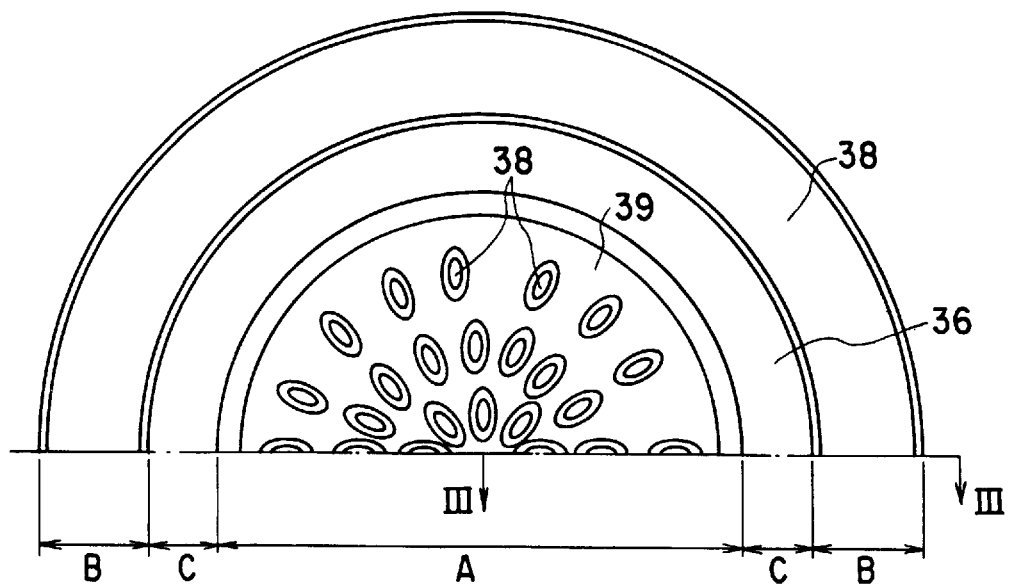
FIG. 2 is a diagram showing a part of the major surface of the conventional reverse conducting GTO thyristor.
Figure 3:
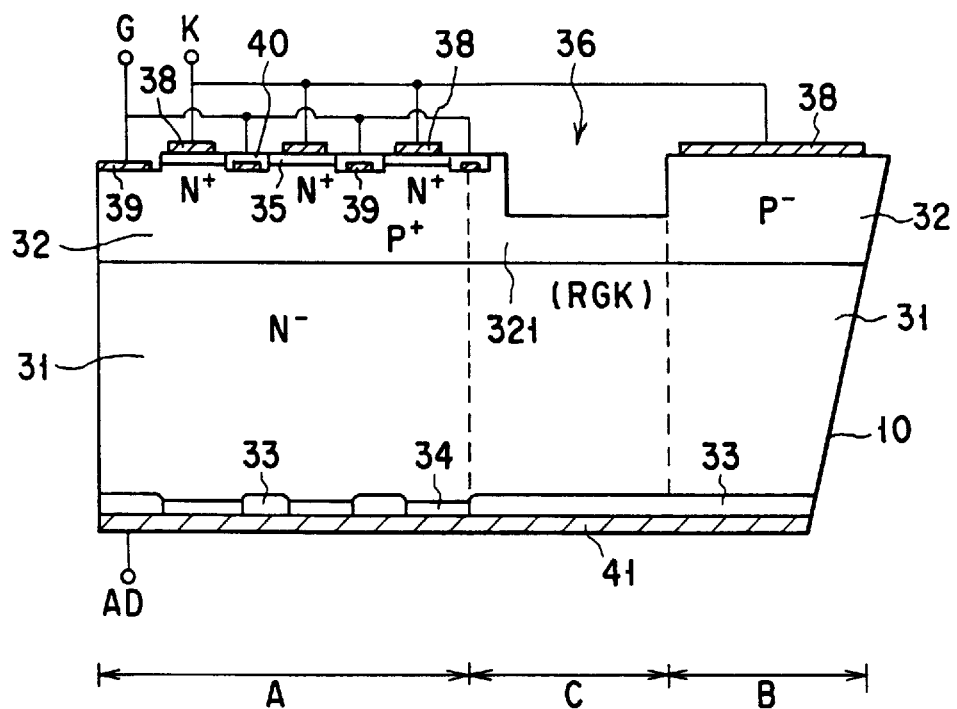
FIG. 3 is a sectional view taken along line III—III in FIG. 2.
Figure 4:
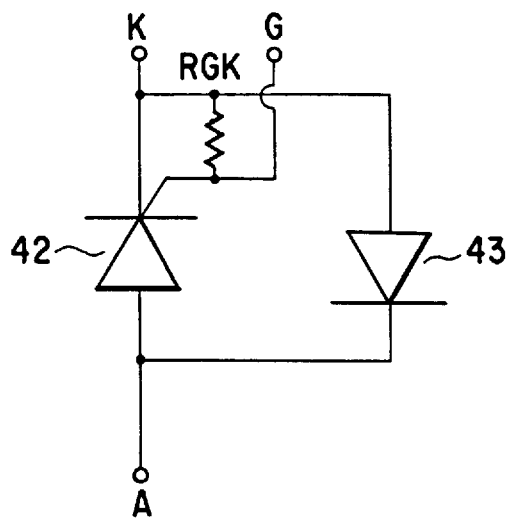
FIG. 4 is an equivalent circuit diagram of the GTO thyristor illustrated in FIG. 3.

In the above mentioned seventh embodiment, the isolation section is an isolation region 3 which is a part of the N⁻ base region 11, and isolates the P⁺ base region 1 of the thyristor section A from the P⁻ anode region 2 of the diode section B. However, the eighth embodiment is characterized by a P⁻⁻ region 22 which is provided in the isolation region 3. Except for this point, the eighth embodiment is identical to the first embodiment shown in FIG. 12. In the first embodiment, the isolation section located between the P⁺ base region 1 and the P⁻ node region 2 is an N⁻ isolation region 3. In the eighth embodiment, the top portion of the isolation region 3 is the P⁻⁻ region 22. The P⁻⁻ region 22 has a predetermined thickness of about 30 to 70 $\mu$m, measured from the surface of the substrate 10; it is thicker than the N⁺ emitter region of the thyristor section. Both the P⁺ base region 1 and the P⁻ anode region 2 are about 80$\mu$m thick, measured from the surface of the substrate 10. The P⁺ base region 1 has a surface impurity concentration of about $10^{18}$ cm⁻³, and the P⁻ anode region 2 has a surface impurity concentration of about $10^{17}$ cm⁻³. On the other hand, the P⁻⁻ region 22 has a surface impurity concentration of about $10^{15}$ cm⁻³. The eight embodiment can be represented by the same equivalent circuit diagram as shown in FIG. 4, but its isolation resistor $R_{GK}$ has a resistance much higher than 70Ω.

Like a ninth embodiment which will be described later, the eighth embodiment is further characterized by the method by which it is manufactured. In the conventional method of manufacturing a reverse conducting GTO thyristor of this type, impurities are ion-implanted into the two regions of a substrate and diffused simultaneously at, for example, 1200° to 1300° C. for about 100 hours, thereby to form a P⁺ base region 1 and a P⁻ anode region 2. The eighth embodiment is manufactured in the following steps. First, p-type impurity is ion-implanted into the entire surface region of the semiconductor substrate 10. Then, the p-type impurity is diffused at, for example, 1200° to 1300° C. for about 20 hours, thereby forming the P⁻⁻ region in the entire surface region of the substrate 10. Next, a p-type impurity is ion-implanted into two selected portions of the P⁻⁻ surface region of the substrate 10 and simultaneously diffused into the substrate 10 at, for example, 1200° to 1300° C. for about 100 ours, thereby forming the P⁺ base region 1 and the P⁻ anode region 2. As a result, the P⁻⁻ region 22 is formed between the P⁺ base region 1 and the P⁻ anode region 2. Since the p-type impurity is ion-implanted, using masking technique, the regions 1, 2 and 22 can be formed with high precision.

Figure 20:
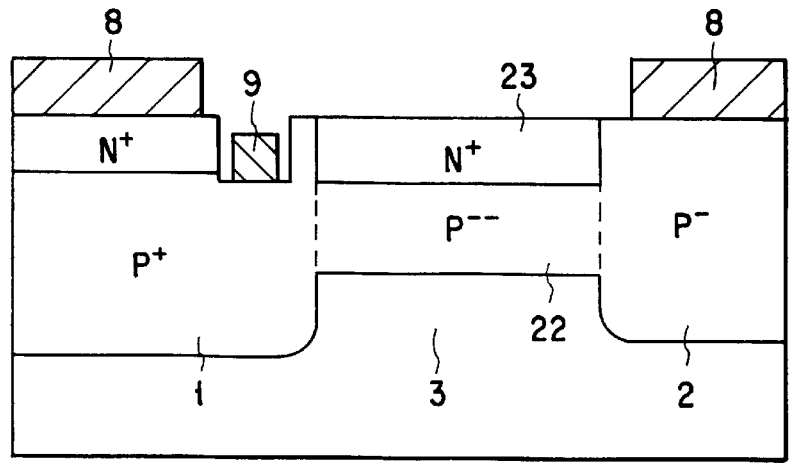
FIG. 20 is a sectional view showing the isolation section and the adjacent portions of the thyristor and diode sections of a reverse conducting GTO thyristor which is a ninth embodiment of the invention.

A reverse conducting GTO thyristor, which is a ninth embodiment of this invention, will now be described with reference to FIG. 20. FIG. 20 is a sectional view of the disc-shaped semiconductor substrate of the eighth embodiment, more precisely the isolation section and the adjacent portions of the thyristor and diode sections. This reverse conducting GTO thyristor comprises a thyristor section, a diode section and an isolation section. The isolation section isolates the thyristor section and the diode section.

As described above, the isolation section of the eight embodiment consists of the N⁻ isolation region 3 and the P⁻⁻ region 22 and isolates the P⁺ base region 1 of the thyristor section and the P⁻ anode region 2 of the diode section. The ninth embodiment is characterized in that a P⁻⁻ region 22 and an N⁺ region 23 are provided in an isolation region 3. Except for this point, the ninth embodiment is identical in structure to the eighth embodiments.

In the ninth embodiment, the isolation section has a lower portion which is an N⁻ isolation region 3, an intermediate portion which is a P⁻⁻ region 22, and a upper portion which is an N⁺ region 23. The N⁺ region 23, which is exposed at the upper surface of the substrate 10, is about 20$\mu$m thick, measured from the upper surface of the substrate 10, and is as deep as an N⁺ emitter region 14. It has the same impurity concentration as the N⁺ emitter region 14. The P⁻⁻ region 22, which is located between the the N⁻ isolation region 3 and the N⁺ region 23, has a thickness of about 20 to 50 $\mu$m.

Both the P⁺ base region 1 and the P⁻ anode region 2 are about 80$\mu$m thick, measured from the surface of the substrate 10. The P⁺ base region 1 has a surface impurity concentration of about $10^{18}$ cm⁻³, and the P⁻ anode region 2 has a surface impurity concentration of about $10^{17}$ cm⁻³. On the other hand, the P⁻⁻ region 22 has a surface impurity concentration of about $10^{15}$ cm⁻³. The eight embodiment can be represented by the same equivalent circuit diagram as shown in FIG. 4, but its isolation resistor $R_{GK}$ has a resistance about 70Ω.

The ninth embodiment has been manufactured by means of ion implantation similar to that used in manufacturing the eighth embodiment. Since the N⁺ region 23 can be formed simultaneously along with the N⁺ emitter region 14, the ninth embodiment can be easily manufactured, without increasing the number of steps of manufacturing the reverse conducting GTO thyristor.

In all embodiments described above, a GTO thyristor is provided in the thyristor section. Nonetheless, the GTO thyristor may be replaced by another type of a switching device, such as an IGBT or an SCR.

Each embodiment described above has a diode section is provided in the peripheral portion of a disc-shaped semiconductor substrate. Nevertheless, the present invention can be applied to a reverse conducting GTO thyristor in which the diode section is located in the center portion of a disc-shaped semiconductor substrate.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A reverse conducting gate-turnoff thyristor comprising:

a semiconductor layer of a first conductivity type;

a first impurity layer of a second conductivity type, provided on a part of a lower surface of said semiconductor layer;

a second impurity layer, which has an impurity concentration, of the second conductivity type provided on an upper surface of said semiconductor layer, opposing said first impurity layer and constituting a part of a switching device section;

a third impurity layer, which has a lower impurity concentration than said second impurity layer, of the second conductivity type, provided on the upper surface of said semiconductor layer spaced apart from said second impurity layer and constituting a part of a diode section;

at least one fourth impurity layer of the first conductivity type provided on the upper surface of said second impurity layer;

a fifth impurity layer, which has a lower impurity concentration than said second impurity layer and said third impurity layer, of the second conductivity type, provided on the upper surface of said semiconductor layer and formed between said second impurity layer and said third impurity layer by means of controlled impurity diffusion, a surface of the fifth impurity layer, a surface of said third impurity layer and a surface of said at least one fourth impurity layer being flush with each other;

anode electrodes provided on a lower surface of said semiconductor layer and on a lower surface of said first impurity layer;

at least one gate electrode provided on that part of the upper surface of said second impurity layer which is other than said at least one fourth impurity layer;

a cathode electrode provided on an upper surface of said at least one fourth impurity layer; and an anode electrode of a diode section, provided on an upper surface of said third impurity layer.

\* \* \* \* \*